United States Patent
Bekku

(10) Patent No.: US 11,243,286 B2
(45) Date of Patent: Feb. 8, 2022

(54) MRI APPARATUS, IMAGE PROCESSING APPARATUS, AND IMAGE PROCESSING METHOD

(71) Applicant: CANON MEDICAL SYSTEMS CORPORATION, Otawara (JP)

(72) Inventor: Mitsuhiro Bekku, Utsunomiya (JP)

(73) Assignee: CANON MEDICAL SYSTEMS CORPORATION, Otawara (JP)

(*) Notice: Subject to any disclaimer, the term of this patent is extended or adjusted under 35 U.S.C. 154(b) by 0 days.

(21) Appl. No.: 16/830,595

(22) Filed: Mar. 26, 2020

(65) Prior Publication Data

US 2020/0309887 A1 Oct. 1, 2020

(30) Foreign Application Priority Data

Mar. 29, 2019 (JP) .............................. JP2019-068937

(51) Int. Cl.
| | |
|---|---|
| *G01R 33/565* | (2006.01) |
| *G06T 11/00* | (2006.01) |
| *G01R 33/48* | (2006.01) |
| *G01R 33/56* | (2006.01) |

(52) U.S. Cl.
CPC ... *G01R 33/56545* (2013.01); *G01R 33/4828* (2013.01); *G01R 33/5608* (2013.01); *G06T 11/005* (2013.01)

(58) Field of Classification Search
CPC .......... G01R 33/56545; G01R 33/4828; G01R 33/5608; G01R 33/56563; G06T 11/005
See application file for complete search history.

(56) References Cited

U.S. PATENT DOCUMENTS

| | | | | |
|---|---|---|---|---|
| 7,656,156 | B2* | 2/2010 | Nozaki | G01R 33/56563 324/309 |
| 9,714,999 | B1* | 7/2017 | Nakai | G01R 33/56545 |
| 2018/0095153 | A1* | 4/2018 | Kimura | G01R 33/56333 |
| 2020/0309884 | A1* | 10/2020 | Bekku | G01R 33/4828 |

OTHER PUBLICATIONS

Berglund, J. et al., "Two-point Dixon Method With Flexible Echo Times," Magnetic Resonance in Medicine, vol. 65, 2011, pp. 994-1004.

* cited by examiner

*Primary Examiner* — Susan S Lee
(74) *Attorney, Agent, or Firm* — Oblon, McClelland, Maier & Neustadt, L.L.P.

(57) ABSTRACT

In one embodiment, an MRI apparatus includes processing circuitry configured to: calculate phase correction data, which includes information on phase rotation amount due to non-uniformity of a static magnetic field, from MR signals; generate an image by using the phase correction data and the MR signals such that a signal from at least one of substances having different magnetic resonance frequencies in an imaging region of an object is suppressed in the image; generate first phase correction data composed of phase data that correspond to phase rotation amount selected from choices of phase rotation amount; calculate discontinuity of the first phase correction data; and generate second phase correction data by substituting at least part of the first phase correction data with non-selected phase data, which corresponds to phase rotation amount being not selected among the choices of phase rotation amount, depending on the discontinuity.

16 Claims, 13 Drawing Sheets

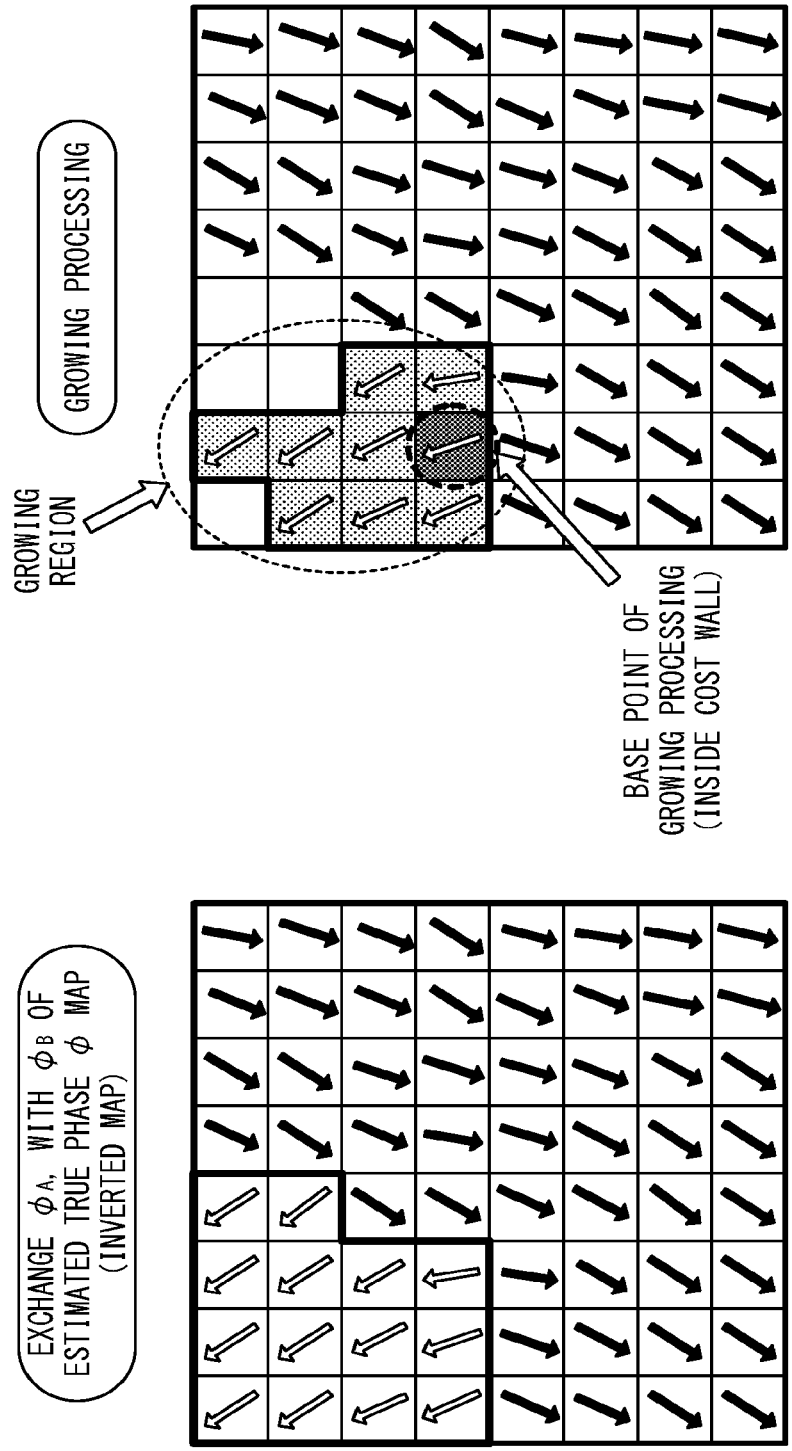

MRI APPARATUS, IMAGE PROCESSING APPARATUS, AND IMAGE PROCESSING METHOD

CROSS-REFERENCE TO RELATED APPLICATION

This application is based upon and claims the benefit of priority from Japanese Patent Application No. 2019-068937, filed on Mar. 29, 2019, the entire contents of which are incorporated herein by reference.

FIELD

Disclosed Embodiments relate to a magnetic resonance imaging (MRI) apparatus, an image processing apparatus, and an image processing method.

BACKGROUND

An MRI apparatus is an imaging apparatus which magnetically excites nuclear spin of an object placed in a static magnetic field with a radio frequency (RF) having the Larmor frequency, and reconstructs an image based on the magnetic resonance (MR) signals emitted from the object due to the excitation.

Among MRI techniques, a Dixon method is known. In the Dixon method, for example, the water image and the fat image are generated from a plurality of images obtained by reconstructing data that are acquired at different echo times TE. For example, from a first image corresponding to a first echo time and a second image corresponding to a second echo time, the water image and the fat image are generated. In the water image, the fat component of the object is suppressed, while, in the fat image, the water component of the object is suppressed.

The phase of each pixel value of the first image and the second image is affected by non-uniformity of a static magnetic field. Thus, when generating the water image and the fat image from the first image and the second image, it is important to correctly estimate the influence of the non-uniformity of the static magnetic field.

For this reason, various techniques have been conventionally developed, by which the effect of the non-uniformity of the static magnetic field is correctly estimated such that the water image and the fat image are accurately calculated. Among such techniques, a technique called a TRW-S (sequential tree-reweighted message-passing) algorithm is known.

In the TRW-S algorithm, the effect of the non-uniformity of the static magnetic field is accurately estimated, by using an assumption that the static magnetic field, if at all, should change continuously and smoothly.

However, even when the TRW-S algorithm is used, the effect of the non-uniformity of the static magnetic field may be erroneously estimated in some cases. If the effect of the non-uniformity of the static magnetic field is erroneously estimated, it may cause so-called a "swap". In the swap event, part of the region that should be depicted as the water component in the water image is erroneously swapped (i.e., replaced or exchanged) with the fat component, or conversely, part of the region that should be depicted as the fat component in the fat image is erroneously swapped with the water component.

BRIEF DESCRIPTION OF THE DRAWINGS

In the accompanying drawings:

FIG. 10A and FIG. 10B are schematic diagrams illustrating the logic and concept of the advanced TRW-S algorithm according to the present embodiment;

DETAILED DESCRIPTION

Hereinafter, embodiments of an MRI apparatus and an image processing apparatus will be described by referring to the accompanying drawings. In the following embodiments, components denoted by the same reference signs are assumed to be the same in terms of function and configuration, and duplicate description is omitted.

In at least one embodiment, an MRI apparatus includes: a scanner configured to acquire a plurality of MR signals at respective different echo times from an imaging region of an object, the imaging region including a plurality of substances that are different in magnetic resonance frequency from each other; and processing circuitry. The processing circuitry is configured to: calculate phase correction data from the plurality of MR signals, the phase correction data including information on phase rotation amount due to non-uniformity of a static magnetic field; and generate an image by using the phase correction data and the plurality of MR signals in such a manner that a signal from at least one of the plurality of substances is suppressed in the image. The processing circuitry is further configured to: generate first phase correction data composed of phase data that correspond to phase rotation amount selected from a plurality of choices of phase rotation amount; calculate discontinuity of the first phase correction data; and generate second phase correction data by substituting at least part of the first phase correction data with non-selected phase data depending on the discontinuity, the non-selected phase data corresponding to phase rotation amount that is not selected among the plurality of choices of phase rotation amount.

(MRI Apparatus)

Figure 1:
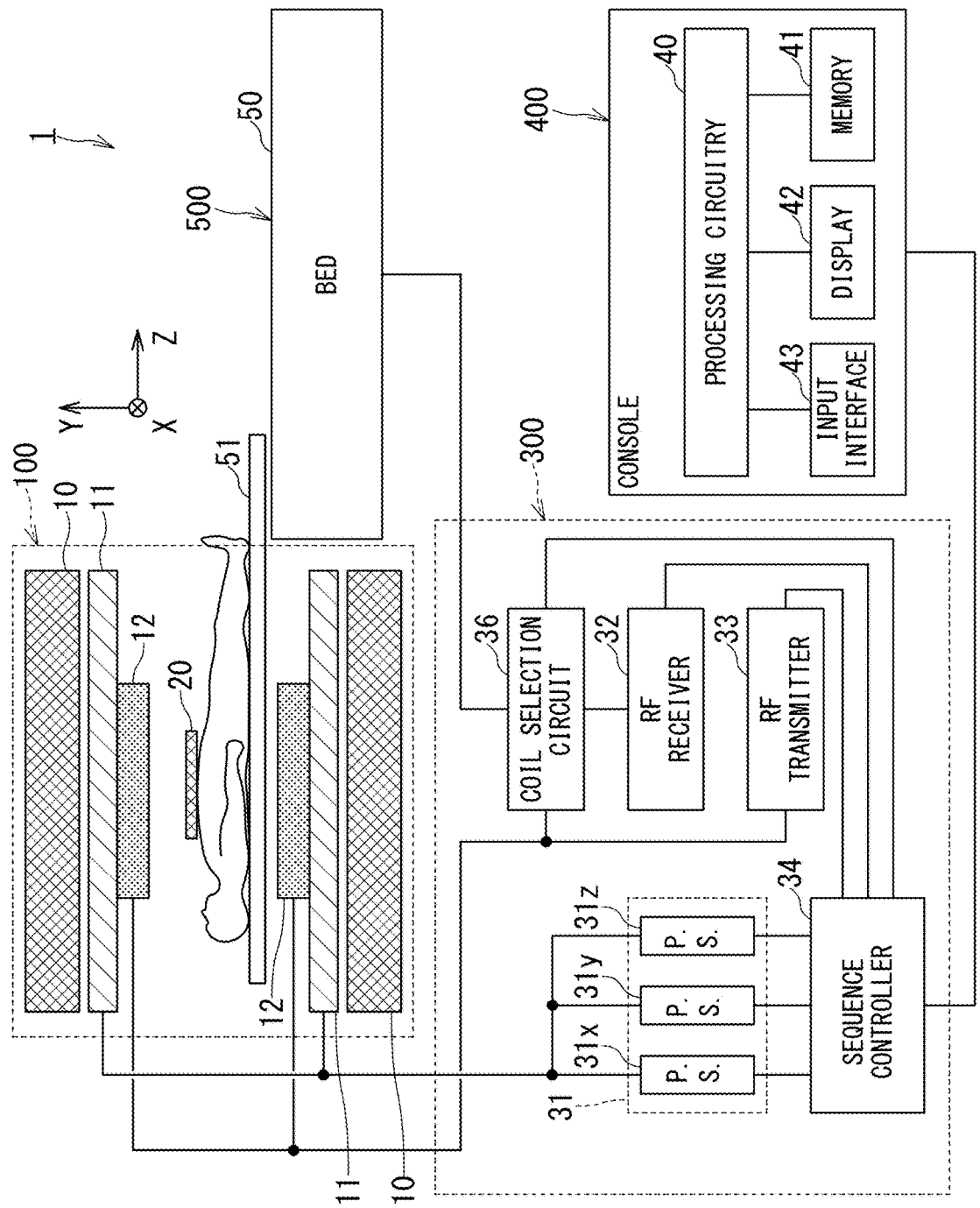
FIG. 1 is a block diagram illustrating an overall configuration of the MRI apparatus of the first embodiment.

FIG. 1 is a block diagram illustrating overall configuration of the MRI apparatus 1 of the first embodiment. The MRI apparatus 1 includes a gantry 100, a control cabinet 300, a console 400, a bed 500, and an RF (Radio Frequency) coil 20.

The gantry 100 includes a static magnetic field magnet 10, a gradient coil assembly 11, and a whole body (WB) coil 12, and these components are housed in a cylindrical housing. The bed 500 includes a bed body 50 and a table 51.

The control cabinet 300 includes three gradient coil power supplies 31 ($31x$ for an X-axis, $31y$ for a Y-axis, and $31z$ for a Z-axis), a coil selection circuit 36, an RF receiver 32, an RF transmitter 33, and a sequence controller 34.

The console 400 includes processing circuitry 40, a memory 41, a display 42, and an input interface 43. The console 400 functions as a host computer.

The static magnetic field magnet 10 of the gantry 100 is substantially in the form of a cylinder, and generates a static magnetic field inside a bore, which is a space formed inside the cylindrical structure and serves as an imaging region of the object (for example, a patient). The static magnetic field magnet 10 includes a superconducting coil inside, and the superconducting coil is cooled down to an extremely low temperature by liquid helium. The static magnetic field magnet 10 generates a static magnetic field by supplying the superconducting coil with an electric current to be provided from a static magnetic field power supply (not shown) in an excitation mode. Afterward, the static magnetic field magnet 10 shifts to a permanent current mode, and the static magnetic field power supply is separated. Once it enters the permanent current mode, the static magnetic field magnet 10 continues to generate a strong static magnetic field for a long time, for example, over one year.

The gradient coil assembly 11 is also substantially in the form of a cylinder and is fixed to the inside of the static magnetic field magnet 10. The gradient coil assembly 11 has a three-channel structure and includes an X-axis gradient coil, a Y-axis gradient coil, and a Z-axis gradient coil.

The bed body 50 of the bed 500 can move the table 51 in the vertical direction and in the horizontal direction. The bed body 50 moves the table 51 with the object placed thereon to a predetermined height before imaging. Afterward, when the object is imaged, the bed body 50 moves the table 51 in the horizontal direction so as to move the object to the inside of the bore.

The WB body coil 12 is shaped substantially in the form of a cylinder so as to surround the object, and is fixed to the inside of the gradient coil assembly 11. The WB coil 12 applies RF pulses to be transmitted from the RF transmitter 33 to the object, and receives MR signals emitted from the object due to excitation of hydrogen nuclei.

The MRI apparatus 1 includes an RF coil 20 in addition to the WB coil 12 as shown in FIG. 1. The RF coil 20 (i.e., surface coil) is a coil to be placed close to the body surface of the object. The RF coil 20 includes a plurality of coil elements. Since the plurality of coil elements are arranged in an array inside the RF coil 20, they are also called a PAC (Phased Array Coil). Depending on the anatomical imaging part of the object, there are various RF coils 20. For example, the various RF coils 20 include: a body coil to be attached on the chest, abdomen, or legs of the object as shown in FIG. 1; and a spine coil to be attached on the back of the object.

The RF transmitter 33 generates an RF pulse on the basis of an instruction from the sequence controller 34. The generated RF pulse is transmitted to the WB coil 12 and applied to the object. An MR signal is generated from the object by each application of the RF pulse. The RF coil 20 or the WB coil 12 receives this MR signal.

The MR signal received by the RF coil 20, more specifically, the MR signal received by each element coil in the RF coil 20 is transmitted to the coil selection circuit 36 via a cable provided on the table 51 and the bed body 50. The coil selection circuit 36 selects a signal outputted from the RF coil 20 or a signal outputted from the WB coil depending on a control signal outputted from the sequence controller 34 or the console 400.

The selected signal is outputted to the RF receiver 32. The RF receiver 32 performs A/D (Analog to Digital) conversion of the channel signal (i.e., the MR signal), and outputs the digitized MR signal to the sequence controller 34. The digitized MR signals are called raw data in some cases. Note that the A/D conversion may be performed inside the RF coil 20 or in the coil selection circuit 36.

The sequence controller 34 performs a scan of the object by driving the gradient coil power supplies 31, the RF transmitter 33, and the RF receiver 32 under the control of the console 400. When the sequence controller 34 receives the raw data from the RF receiver 32 by performing the scan, the sequence controller 34 transmits the received raw data to the console 400.

The sequence controller 34 includes processing circuitry (not shown). This processing circuitry is configured as, for example, a processor for executing predetermined programs or configured as hardware such as a field programmable gate array (FPGA) and an application specific integrated circuit (ASIC).

The console 400 includes a memory 41, an input interface 43, a display 42, and processing circuitry 40. The memory 41 is a recording medium including a read-only memory (ROM) and a random access memory (RAM) in addition to an external memory device such as a hard disk drive (HDD) and an optical disc device. The memory 41 stores various programs to be executed by a processor of the processing circuitry 40 as well as various data and information.

The input interface 43 includes various devices for an operator to input various data and information, and is configured of, for example, a mouse, a keyboard, a trackball, and/or a touch panel.

The display 42 is a display device such as a liquid crystal display panel, a plasma display panel, and an organic EL panel.

The processing circuitry 40 is, for example, a circuit provided with a central processing unit (CPU) and/or a special-purpose or general-purpose processor. The processor implements various functions described below by executing the programs stored in the memory 41. The processing circuitry 40 may be configured of hardware such as an FPGA and an ASIC. The various functions described below can also be implemented by such hardware. Additionally, the processing circuitry 40 can implement the various functions by combining hardware processing and software processing based on its processor and programs.

In the configuration of the MRI apparatus 1 shown in FIG. 1, the control cabinet 300, the gantry 100, and the bed 500 (i.e., all the components except the console 400) constitute an imaging unit. The imaging unit is also referred to as a scanner.

The MRI apparatus 1 of the present embodiment executes an imaging method or image processing method called a Dixon method.

Figure 2:
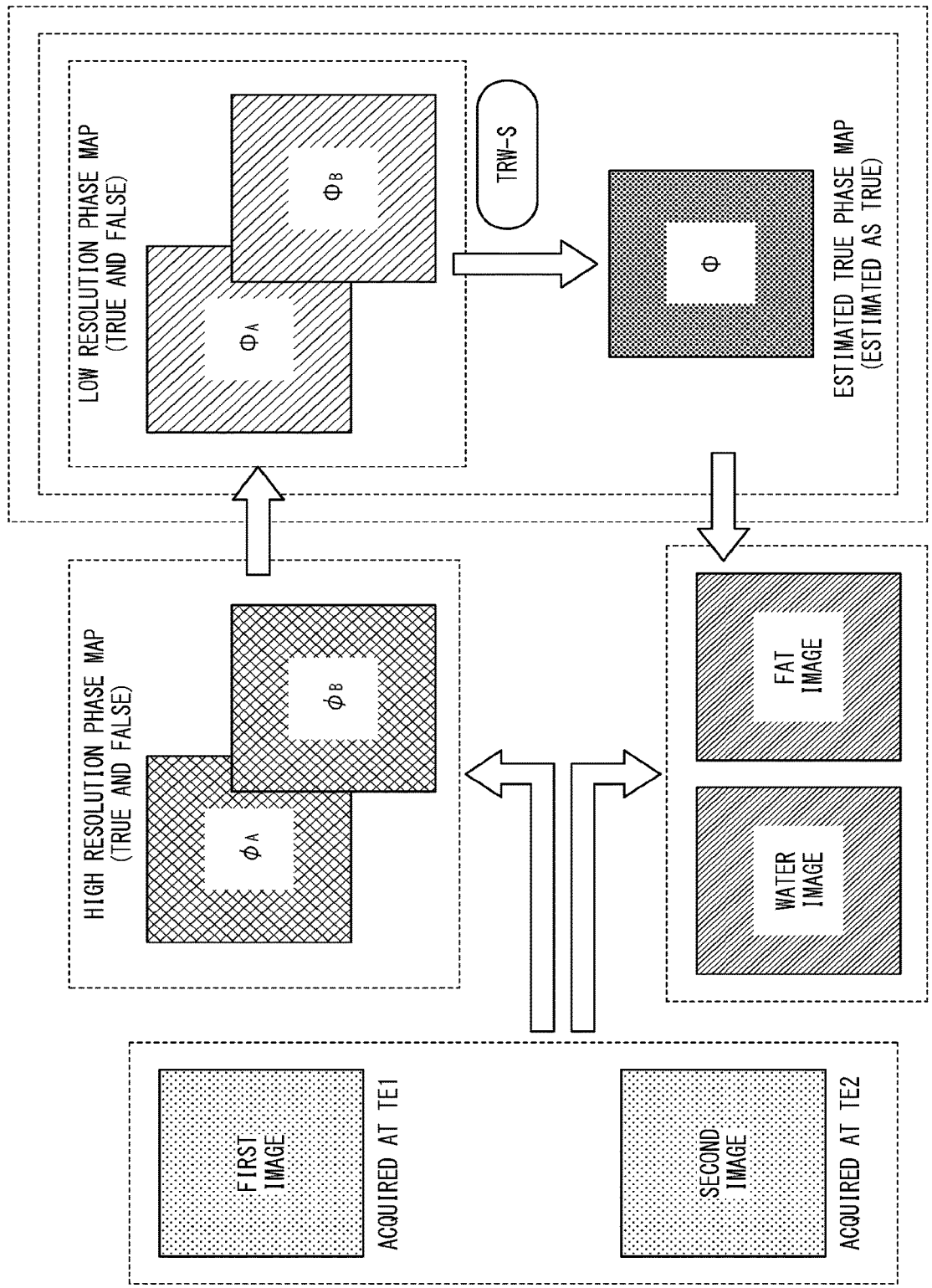
FIG. 2 is a schematic diagram illustrating an overall outline of the Dixon method to be performed by the MRI apparatus of the present embodiment.

FIG. 2 is a schematic diagram illustrating an overall outline of the Dixon method executed by the MRI apparatus 1 of the present embodiment.

As mentioned above, in the Dixon method, for example, the water image and the fat image are generated from a plurality of images obtained by reconstructing data that are acquired at different echo times TE. For example, from a first image corresponding to a first echo time and a second image corresponding to a second echo time, two images, i.e., the water image and the fat image are generated, in each of which water and fat are separated from each other. In the water image, the fat component of the object is suppressed, while, in the fat image, the water component of the object is suppressed.

Hereinafter, a description will be given of the so-called two-point Dixon method in which a water image and a fat image are generated from two images, i.e., the first image and the second image.

However, the present embodiment is not limited to the two-point Dixon method but can be extended to a so-called multipoint Dixon method in which a water image and a fat image are generated by using three or more images corresponding to respective three or more echo times.

In the Dixon method, by using the fact that the water component and the fat component in each tissue in the imaging region are different in magnetic resonance frequency, a water image, in which the fat component is suppressed, is generated, or a fat image, in which a water component is suppressed, is generated. However, the substances to be processed by the Dixon method are not limited to water and fat. When a plurality of substances included in the imaging region have different magnetic resonance frequencies, these substances can be separated by using the Dixon method. In this case, the MRI apparatus 1 of the present embodiment can generate an image in which signals from at least one of the plurality of substances are suppressed. The following description, however, will be given of the case where the substances to be processed are a water component and a fat component, from the viewpoint of simplicity.

The phase of each pixel value of the first image and the second image is affected by the non-uniformity of the static magnetic field. Thus, when calculating the water image and the fat image from the first image and the second image, it is important to correctly estimate the effect of the non-uniformity of the static magnetic field.

The complex pixel value $S_1$ of the first image and the complex pixel value $S_2$ of the second image are affected by the phase $\varphi$ caused by the static-magnetic-field non-uniformity $\Delta B$. As described below, the phase $\varphi$ can be obtained by solving an equation including known parameters such as the complex pixel value $S_1$ of the first image, the complex pixel value $S_2$ of the second image, and the echo times TE1 and TE2 corresponding to the respective images. However, since this equation is a quadratic equation, the solutions of this quadratic equation yield two phases of $\varphi_A$ and $\varphi_B$, which correspond to positive and negative signs, respectively.

The phase $\varphi_A$ and the phase $\varphi_B$ are calculated as a pair, one of which is the true phase and the other represents the false phase. Since the pair of the phase $\varphi_A$ and the phase $\varphi_B$ are calculated for each pixel of the first image and the second image, a set of phases $\varphi_A$ can be represented as a phase map $\varphi_A$ by arranging the phases $\varphi_A$ at corresponding pixel positions as shown in the upper center of FIG. 2. Similarly, a set of phases $\varphi_B$ can be represented as a phase map $\varphi_B$ by arranging the phases $\varphi_B$ at corresponding pixel positions.

In order to correctly determine the non-uniformity of the static magnetic field, it is necessary to correctly determine which of the phase φA and the phase φB is true and which is false, and determine one of the phases φA and φB as the true phase $\varphi$.

In the TRW-S algorithm, as mentioned above, the effect of the non-uniformity of the static magnetic field is accurately estimated, by using an assumption that the static magnetic field, if at all, should change continuously and smoothly. Non-Patent Document 1 discloses a conventional TRW-S algorithm in detail.

[Non-Patent Document 1] Johan Berglund et al., Two-point Dixon Method With Flexible Echo Times, MRM 65:994-1004 (2011) In the Non-Patent Document 1, prior to execution of the TRW-S algorithm, pixel/voxel decimation processing (i.e., processing of reducing resolution, hereinafter, simply referred to as the decimation processing) is performed on the phase map $\varphi_A$ and the phase map $\varphi_B$ in order to reduce the processing load. Further, as shown in the right part of FIG. 2, the TRW-S algorithm is applied to the phase map $\Phi_A$ and phase map $\Phi_B$, both of which have been subjected to the decimation processing, to obtain a true phase map.

However, even if the TRW-S algorithm described in Non-Patent Document 1 is applied, the true phase may still be erroneously estimated. That is, the false phase may be erroneously selected as the true phase from the phases $\Phi_A$ and $\Phi_B$. If the false phase is erroneously selected as the true phase, and then the water image and the fat image are generated by using the selected phase, it may cause a swap event. In the swap event, part of the region that should be depicted as the water component in the water image is erroneously swapped with the fat component, or conversely, part of the region that should be depicted as the fat component in the fat image is erroneously swapped with the water component.

Figure 3:
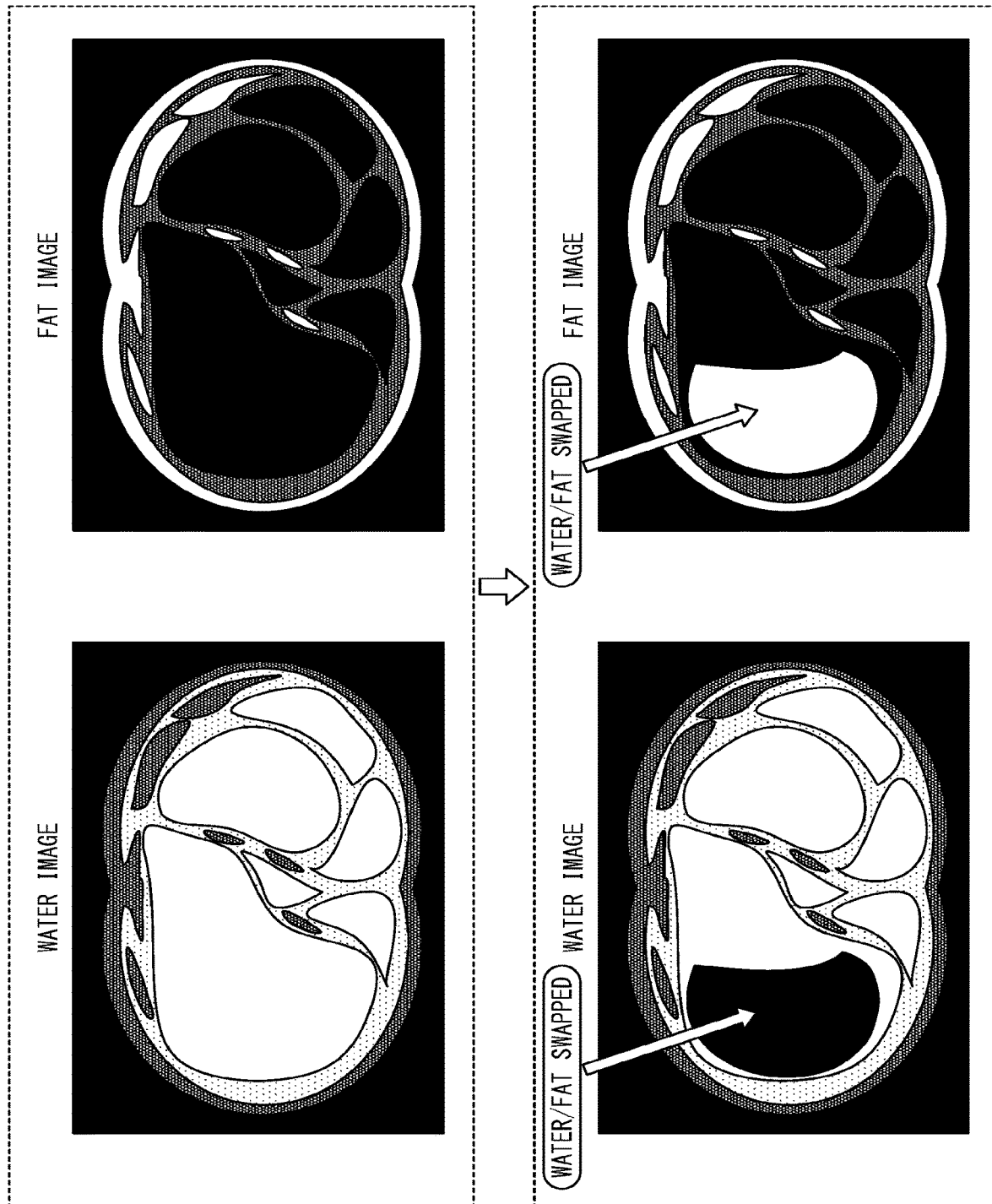
FIG. 3 is a schematic diagram illustrating a water image and a fat image when a water region and a fat region are swapped with each other.

FIG. 3 is a schematic diagram illustrating a water image and a fat image when a water region and a fat region are swapped with each other. FIG. 3 schematically shows an example of an axial cross-section including the liver. The upper part of FIG. 3 illustrates a correct water image and a correct fat image, in both of which the water region and the fat region are not swapped. The lower part of FIG. 3 illustrates an incorrect water image and an incorrect fat image, both of which are erroneously generated as a result of the swap of the water region and the fat region.

The MRI apparatus 1 of the present embodiment deals with such a swap event between the water region and the fat region. In particular, the MRI apparatus 1 of the present embodiment provides a more advanced TRW-S algorithm than the conventional TRW-S algorithm for suppressing the swap event between the water region and the fat region.

Figure 4:
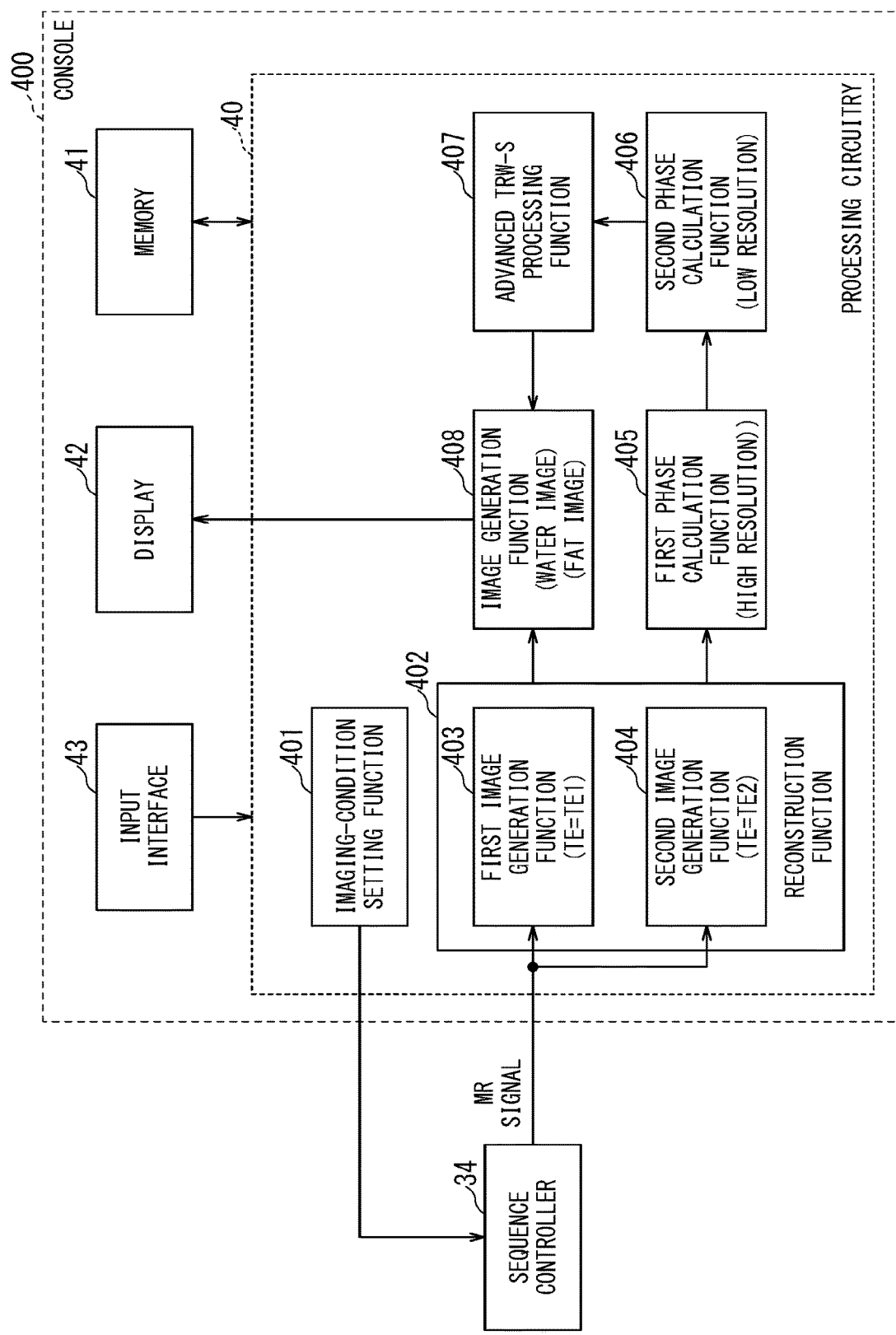
FIG. 4 is a block diagram illustrating a functional configuration of the MRI apparatus that executes an advanced TRW-S algorithm.

FIG. 4 is a functional block diagram of the processing circuitry 40 focusing on the processing function of the Dixon method in which the advanced TRW-S algorithm is executed.

Figure 5:
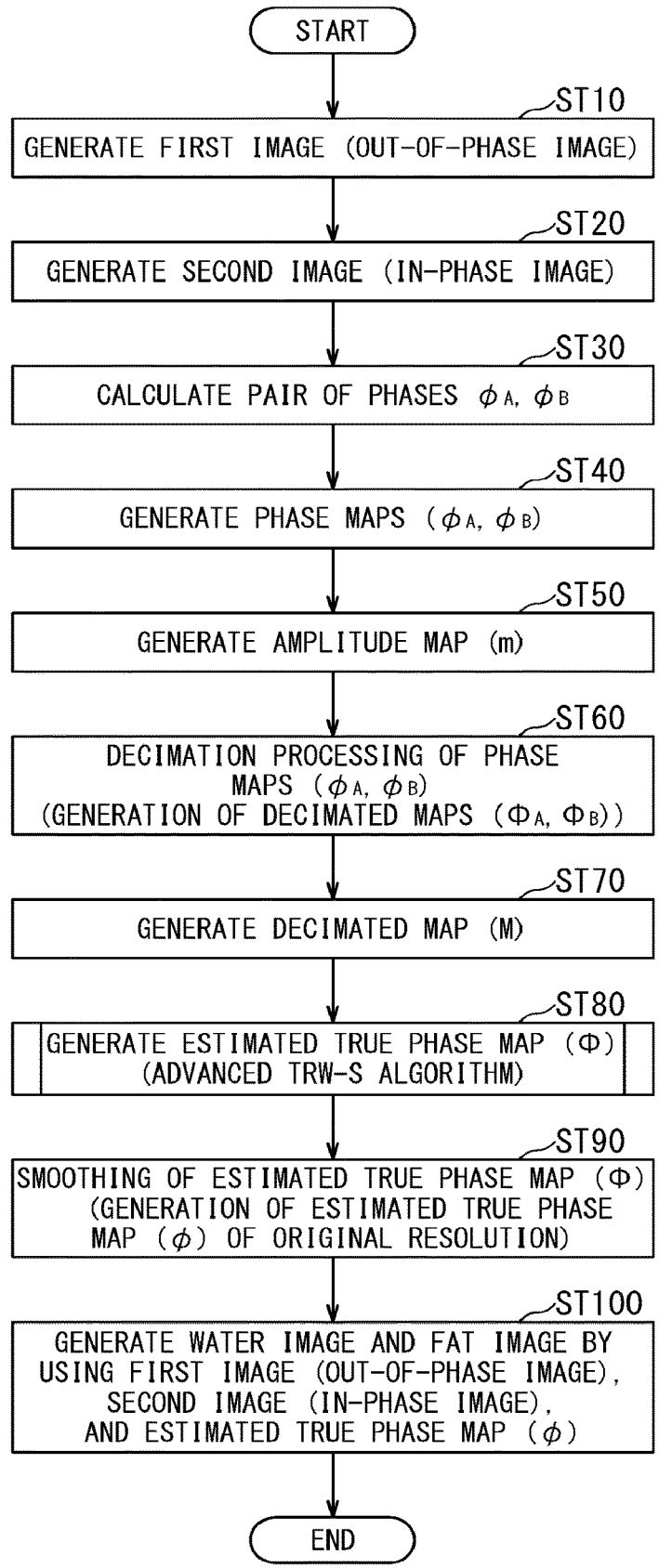
FIG. 5 is an overall flowchart illustrating an operation including the advanced TRW-S algorithm to be executed by the MRI apparatus.

FIG. 5 is an overall flowchart for illustrating an operation executed by the MRI apparatus.

As shown in FIG. 4, the processing circuitry 40 of the console 400 implements an imaging-condition setting function 401, a reconstruction function 402, a first-image (TE=TE1) generation function 403, a second-image (TE=TE2) generation function 404, a first-phase calculation function 405, a second-phase calculation function 406, an advanced TRW-S function 407, and an image generation function 408. For example, the processing circuitry 40 implements each of these functions by causing its processor to execute predetermined programs stored in the memory 41. The operation of each of these functions will be described by referring to the overall flowchart of FIG. 5. The advanced TRW-S function 407, in particular, will be described by referring to detailed flowcharts shown in FIG. 7 and FIG. 8 and some related drawings.

First, in the step ST10 of FIG. 5, the first image is generated. In the step ST20, the second image is generated. Specifically, the imaging-condition setting function 401 shown in FIG. 4 sets a first pulse sequence for generating the first image, and the first-image generation function 403 performs predetermined processing on the MR signals acquired by execution of the first pulse sequence so as to reconstruct the first image. Similarly, the imaging-condition setting function 401 sets a second pulse sequence for generating the second image, and the second-image generation function 404 performs predetermined processing on the MR signals acquired by execution of the second pulse sequence so as to reconstruct the second image.

Between the first and second pulse sequences, the echo time TE is set to a different value, whereas the type of pulse sequence is basically set to be the same and all the parameters of the pulse sequence except the echo time are set to be basically the same. Each of the first and second pulse sequences may be a SE (Spin Echo) pulse sequence or a GRE (Gradient Echo) pulse sequence.

The echo time of the first pulse sequence is set to TE1, and the echo time of the second pulse sequence is set to TE2. As is well known, the water component and the fat component are different in magnetic resonance frequency (for example, both are separated by about 3.5 ppm). When the echo times TE are different, the phase rotation amount of the water component and the phase rotation amount of the fat component are different. When the respective echo times TE1 and TE2 of the first and second pulse sequence are set such that the phase of the water component and the phase of the fat component are opposite to each other, an image generated from MR signals acquired by these first and second pulse sequence is called an Out-of-Phase image. On the other hand, when the respective echo times TE1 and TE2 of the first and second pulse sequence are set such that the phase of the water component and the phase of the fat component are in phase, an image generated from MR signals acquired by these first and second pulse sequence is called an In-Phase image.

In order to generate a water image and a fat image, it is sufficient if the echo times TE1 and TE2 are known, and it is not necessarily required that one of the first and second images is an Out-of-Phase image and the other is an In-Phase image. Note that, however, for facilitating understanding, a description will be given of the case where the first image is an Out-of-Phase image and the second image is an In-Phase image, hereafter. Further, note that most of equations or expressions used in the following are cited from the Non-Patent Document 1.

The process of calculating the phase $\varphi_A$ and the phase $\varphi_B$ from the first image and the second image will be described below. When each pixel value (complex number) of the first image is denoted as $S_1$ and each pixel value (complex number) of the second image is denoted as $S_2$, the pixel values $S_1$ and $S_2$ can be represented by Expressions 1 and 2 below.

$$S_1 = (W + a_1 F) b_0 \qquad \text{Expression 1}$$

$$S_2 = (W + a_2 F) b_0 b \qquad \text{Expression 2}$$

In Expressions 1 and 2, W is a signal value (real number) when the echo time TE for water is zero, and F is a signal value (real number) when the echo time TE for fat is zero.

The symbol "$b_0$" is a phase term ($b_0 = \exp(j\varphi_0)$) when the phase of the water signal in the case of TE=TE1 is defined as $\varphi_0$. The symbol "b" is a phase term ($b = \exp(j\varphi)$) when $\varphi$ is defined as a phase that rotates mainly due to non-uniformity of the static magnetic field during the time $\Delta T$ ($\Delta T = TE2 - TE1$) between the echo times TE2 and TE1. The parameters $a_1$ and $a_2$ are represented by Expressions 3 and 4 below.

$$a_1 = \exp(-j2\pi\gamma B_0 \delta TE_1) \qquad \text{Expression 3}$$

$$a_2 = \exp(-j2\pi\gamma B_0 \delta TE_2) \qquad \text{Expression 4}$$

In Expressions 3 and 4, $\gamma$ is the gyromagnetic ratio, $B_0$ is the static magnetic field strength, $\delta$ is the chemical shift of fat with respect to water (about 3.5 ppm), the echo time TE1 is the time length from the application timing of the excitation pulse (time t is zero) to the peak timing of the echo (time t=TE1) in the first pulse sequence for acquiring the first image, and the echo time TE2 is the time length from the application timing of the excitation pulse (t=0) to the peak timing of the echo (t=TE2) in the second pulse sequence for acquiring the second image. Note that, the parameters $a_1$ and $a_2$ are known parameters determined by parameters of the pulse sequence such as echo time TE, which are set as the imaging conditions.

When Expression 1 and Expression 2 are respectively squared, Expression 5 and Expression 6 below are obtained.

$$|S_1|^2 = W^2 + F^2|a_1|^2 + 2WF Re(a_1) \qquad \text{Expression 5}$$

$$|S_2|^2 = W^2 + F^2|a_2|^2 + 2WF Re(a_2) \qquad \text{Expression 6}$$

When Q=F/(W+F) is introduced as a fat ratio, Expression 5 and Expression 6 become quadratic equations of Q. The solution of this quadratic equation is Expression 7 below.

$$Q_{A,B} = \frac{c_1 \pm \sqrt{c_3}}{c_1 + c_2} \qquad \text{Expression 7}$$

In Expression 7, c1, c2, and c3 are expressed by Expressions 8 to 10 below.

$$c_1 = |S_1|^2(1 - Re(a_2)) - |S_2|^2(1 - Re(a_1)) \qquad \text{Expression 8}$$

$$c_2 = |S_1|^2(|a_2|^2 - Re(a_2)) - |S_2|^2(|a_1|^2 - Re(a_1)) \qquad \text{Expression 9}$$

$$c_3 = |S_1|^2|S_2|^2|a_1 - a_2|^2 - (Im(a_1)|S_2|^2 - Im(a_2)|S_1|^2)^2 \qquad \text{Expression 10}$$

Expressions 11 and 12 are obtained from Expressions 1, 2, and 7 as follows.

$$b_A = \frac{S_2(1 + Q_A(a_1 - 1))}{S_1(1 + Q_A(a_2 - 1))} \qquad \text{Expression 11}$$

$$b_B = \frac{S_2(1 + Q_B(a_1 - 1))}{S_1(1 + Q_B(a_2 - 1))} \qquad \text{Expression 12}$$

The symbols "$b_A$" in Expression 11 and "$b_B$" in Expression 12 are respectively related to the phase $\varphi_A$ and the phase $\varphi_B$ by Expressions 13 and 14 below.

$$b_A = \exp(j\varphi_A) \qquad \text{Expression 13}$$

$$b_B = \exp(j\varphi_B) \qquad \text{Expression 14}$$

As described above, on the basis of Expression 1 to Expression 14, the phase $\varphi_A$ and the phase $\varphi_B$ can be calculated from the pixel value $S_1$ of the first image, the pixel value $S_2$ of the second image, and the known parameters $a_1$ and $a_2$. Note that "$b_A$" and "$b_B$" correspond to the respective signs of ± in Expression 7, and similarly, the phases $\varphi_A$ and $\varphi_B$ correspond to the respective signs of ± in Expression 7. One of the phase $\varphi_A$ and the phase $\varphi_B$ is the true phase corresponding to the actual static magnetic field distribution, and the other of the phases $\varphi_A$ and $\varphi_B$ is the false phase.

The computation processing from Expressions 1 to 14 corresponds to the processing of the step ST30 in FIG. 5. The phase $\varphi_A$ is calculated for each pixel value $S_1$ of the first image, and the phase $\varphi_B$ is calculated for each pixel value $S_2$ of the second image. The phase map $\varphi_A$ generated in the step ST40 is obtained by arranging the phases $\varphi_A$ at the corresponding pixel positions, and the phase map $\varphi_B$ generated in the step ST40 is obtained by arranging the phases $\varphi_B$ at the corresponding pixel positions.

In the step ST50, an amplitude m is calculated from the pixel value $S_1$ of the first and the pixel value $S_2$ of the second image by, for example, Expression 15 below, and then an amplitude map, in which the amplitudes m are arranged at the corresponding pixel positions, is generated.

$$m = |S_1| + |S_2| \quad \text{Expression 15}$$

Instead of Expression 15, the amplitude map may be generated by using only the amplitude of the pixel values of the In-Phase image (second image).

In the step ST60, the phase map $\varphi_A$ and the phase map $\varphi_B$ generated in the step ST40 are subjected to a decimation processing (i.e., reduced in resolution), and a low-resolution phase map $\varphi_A$ and a low-resolution phase map $\varphi_B$ are generated. The decimation processing is performed in order to reduce the processing load of the advanced TRW-S algorithm executed in the step ST80. Similarly, in the step ST70, the amplitude map (m) generated in the step ST50 is subjected to the decimation processing to generate a low-resolution amplitude map (M).

Incidentally, before the decimation processing, both the phase $\varphi$ and the phase map $\varphi_A$, $\varphi_B$ are written in lowercase, and after the decimation processing, the phase $\Phi$ and the phase map $\Phi_A$, $\Phi_B$ are written in uppercase.

In the step ST80, the advanced TRW-S algorithm is executed by using the low-resolution phase maps $\Phi_A$ and $\Phi_B$ and the low-resolution amplitude map (M) to estimate the true phase $\Phi$ from the low-resolution phase maps $\Phi_A$ and $\Phi B$, and generate a low-resolution estimated true phase map ($\Phi$). Details of the processing of the step ST80 will be described below.

In the step ST90, the processing circuitry 40 performs smoothing processing on the estimated true phase map ($\Phi$) generated as a low-resolution map in the step ST80 so as to generate an estimated true phase map ($\varphi$), resolution of which is increased to the resolution of the original images (first and second images).

Finally, in the step ST100, each pixel value W of the water image and each pixel value F of the fat image are calculated by using the first and second images and the estimated true phase map ($\varphi$) on the basis of Expressions 16 to 20 below.

$$b_0 = \exp\left(jL \frac{s_1(1-a_2) - s_2(1-a_1)/b}{a_1 - a_2}\right) \quad \text{Expression 16}$$

$$S = A \begin{bmatrix} W \\ F \end{bmatrix} \quad \text{Expression 17}$$

$$S = \begin{bmatrix} \text{Re}(S_1/b_0) \\ \text{Im}(S_1/b_0) \\ \text{Re}(S_2/b_0 b) \\ \text{Im}(S_2/b_0 b) \end{bmatrix} \quad A = \begin{bmatrix} 1 & \text{Re}(a_1) \\ 0 & \text{Im}(a_1) \\ 1 & \text{Re}(a_2) \\ 0 & \text{Im}(a_2) \end{bmatrix} \quad \text{Expression 18}$$

$$\begin{bmatrix} W_{LS} \\ F_{LS} \end{bmatrix} = A^+ S \quad \text{Expression 19}$$

$$A^+ = (A^T A)^{-1} A^T \quad \text{Expression 20}$$

The symbol "b" in Expression 16 is the phase term (b=exp(jφ)) corresponding to the true phase $\varphi$ to be estimated by the advanced TRW-S algorithm. The symbol $W_{LS}$ in Expression 19 is the pixel value of the water image to be finally obtained, and $F_{LS}$ in Expression 19 is the pixel value of the fat image to be finally obtained. Expression 20 is an inverse matrix (i.e., Moore-Penrose inverse matrix) for minimizing the respective square errors of $W_{LS}$ and $F_{LS}$.

(Advanced TRW-S Algorithm)

Hereinafter, the advanced TRW-S algorithm of the step ST80 will be described. Note that the advanced TRW-S algorithm of the present embodiment does not depend on the level of resolution. Thus, in the following, the advanced TRW-S algorithm of the present embodiment will be described by using the phase maps $\varphi_A$ and $\varphi_B$ generated in the step ST40 before the decimation processing and the amplitude map (m) generated in the step ST50.

Figure 6:
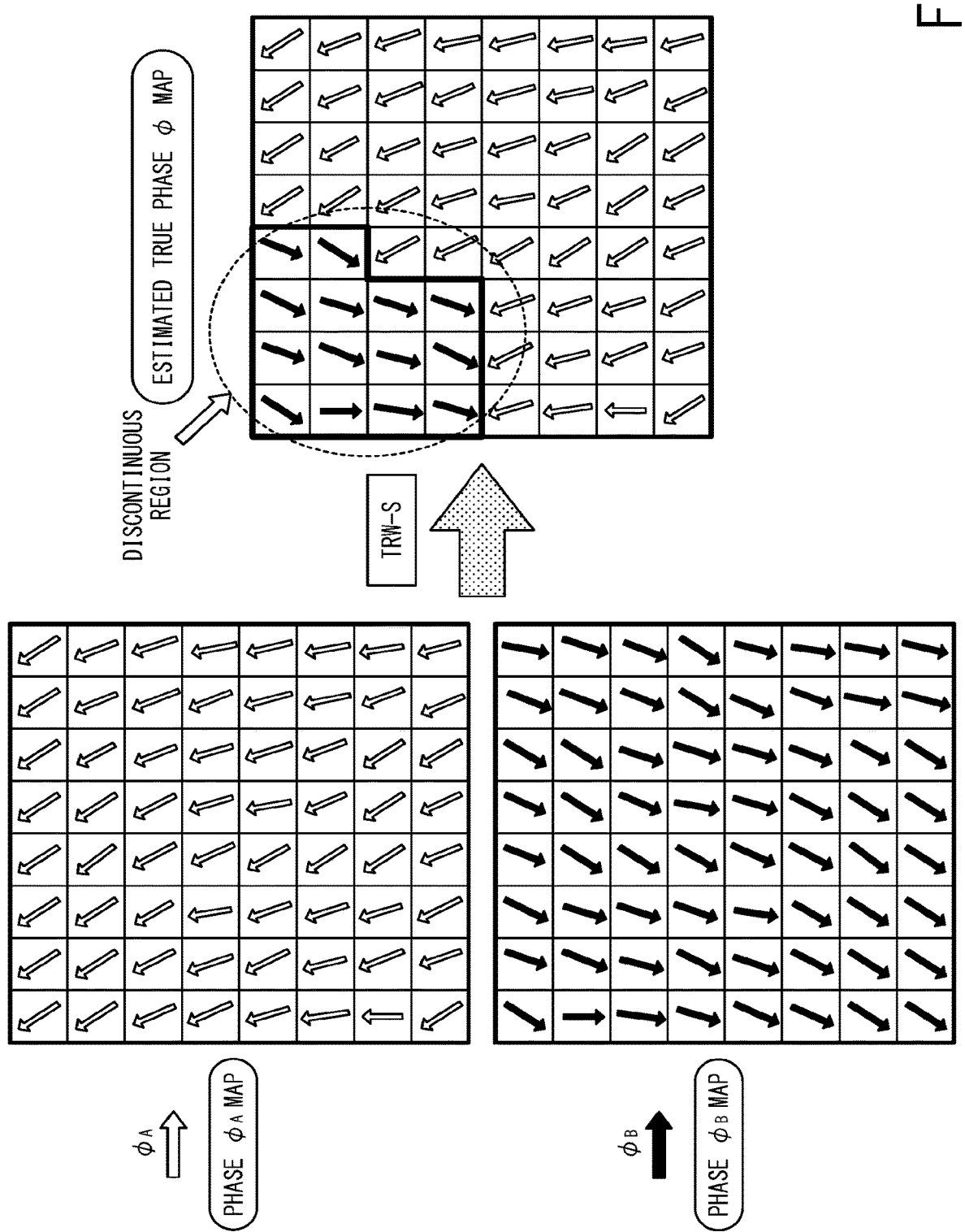
FIG. 6 is a schematic diagram illustrating a problem of the conventional TRW-S algorithm.

Prior to describing the advanced TRW-S algorithm, problems of the conventional TRW-S algorithm will be described by referring to FIG. 6. The left side of FIG. 6 illustrates the phase map $\varphi_A$ and the phase map $\varphi_B$ generated in the step ST40. In the following, each phase is represented by a vector of magnitude 1, each vector represented by a white arrow represents the phase $\varphi_A$, and each vector represented by a black arrow represents the phase $\varphi_B$.

The right side of FIG. 6 is the true phase map ($\varphi$) (hereinafter, referred to as the estimated true phase map ($\varphi$)) estimated from the phase map $\varphi_A$ and the phase map $\varphi_B$ by the TRW-S algorithm. Since each phase $\varphi$ is generated from the static magnetic field distribution, the spatial distribution of the phase $\varphi$ should show a continuous distribution. However, in the estimated true phase map ($\varphi$) obtained by the TRW-S algorithm, the direction of the (black) vector in the upper left region is almost opposite to the direction of the (white) vector in the other region, and the estimated true phase map ($\varphi$) shows discontinuity at the boundary between both regions. Thus, it is highly likely that the phase $\varphi$ is incorrectly estimated in the black-vector region in the upper left.

Figure 7:
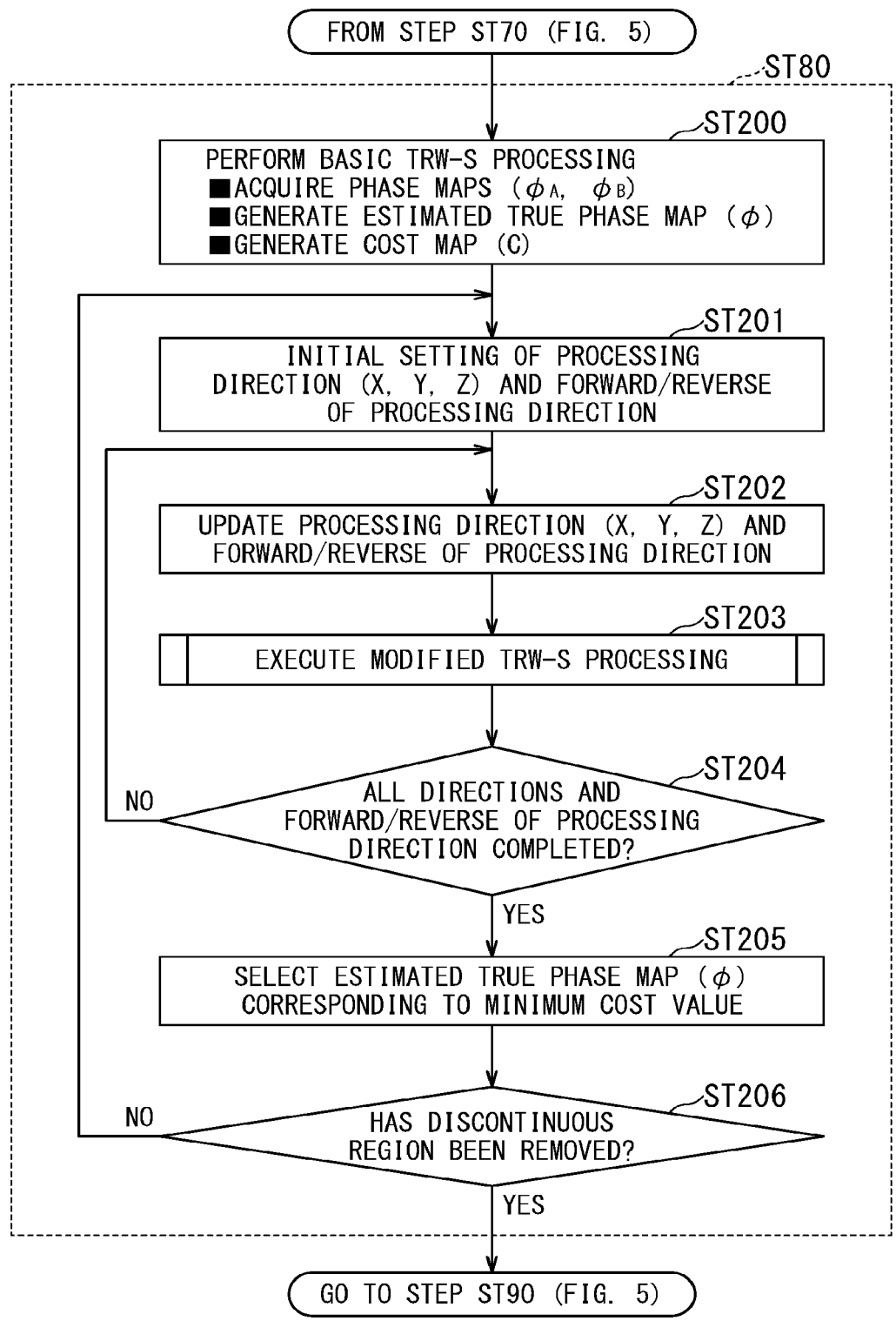
FIG. 7 is a first partial flowchart illustrating a detailed operation of the advanced TRW-S function.
Figure 8:
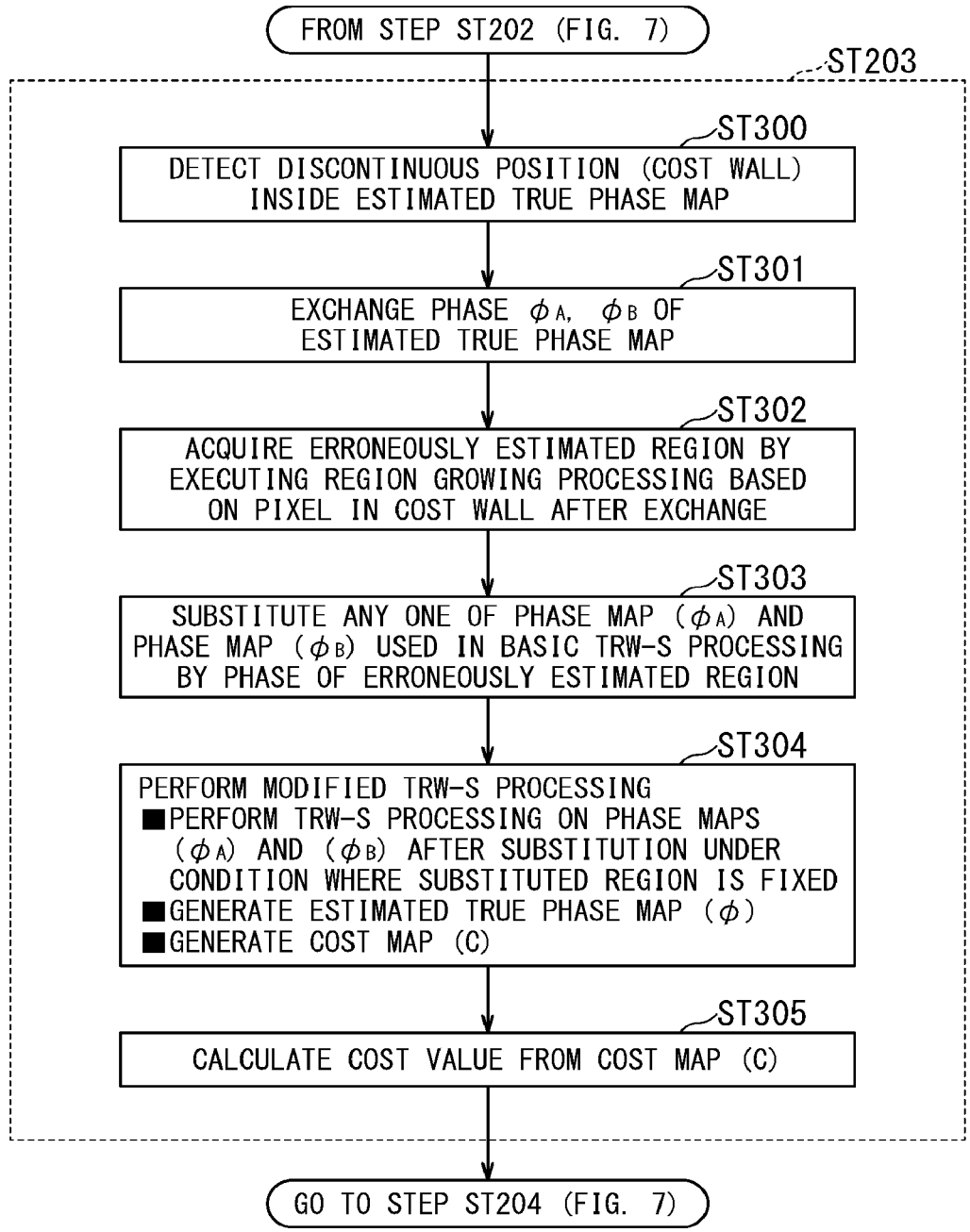
FIG. 8 is a second partial flowchart illustrating a detailed operation of the advanced TRW-S function.

The advanced TRW-S algorithm aims to reduce such erroneous estimation as much as possible. Each of FIG. 7 and FIG. 8 is a flowchart illustrating an operation of the advanced TRW-S algorithm (step ST80 in FIG. 5). Hereinafter, the advanced TRW-S algorithm of the present embodiment will be described by referring to these flowcharts and FIG. 9A to FIG. 12.

In the step ST200, the conventional basic TRW-S processing (i.e., TRW-S processing described in Non-Patent Document 1) is performed. In the basic TRW-S processing, the phase map $\varphi_A$ and the phase map $\varphi_B$ are acquired, and then the estimated true phase map ($\varphi$) is generated. In the basic TRW-S processing, the estimated true phase map ($\varphi$) is obtained by repeated calculation. In the processing of generating the finally estimated true phase map ($\varphi$), a map (hereinafter, referred to as a cost map), in which a value represented by Expression 21 below is set as a cost pixel, is generated with respect to the estimated true phase map (φ) at an intermediate stage.

$$C_{st}(b_s, b_t) = \min(m_s, m_t)|b_s - b_t|^2 \quad \text{Expression 21}$$

In Expression 21, $b_s$ and $b_t$ are respectively phase terms corresponding to adjacent phases $\varphi_s$ and $\varphi_L$ in the estimated true phase map (φ). Further, $m_s$ and $m_L$ are adjacent amplitude values in the amplitude map (m).

Further, the cost value C represented by Expression 22 below is calculated by integrating each cost pixel of the cost map.

$$c = \sum_{(s,t) \in \varepsilon} c_{st}(b_s, b_t) \quad \text{Expression 22}$$

In the basic TRW-S, the processing completes when the cost value indicated by Expression 22 becomes equal to or less than a predetermined value, and the estimated true phase map at the time of completion is treated as the finally estimated true phase map.

In the present embodiment, subsequent to the basic TRW-S algorithm of the step ST200, the processing of the steps ST201 to ST206 described below is further performed.

In the step ST201, the processing circuitry 40 performs initial settings of the processing direction and the forward/reverse of the processing direction. In the loop from the steps ST202 to ST204, the processing circuitry 40 repeatedly performs the processing of the step ST203, while updating the processing direction and the forward/reverse of the processing direction.

Here, the setting of the processing direction is to set which of three directions orthogonal to each other is to be processed. The three directions orthogonal to each other may be, for example, the X-axis direction, the Y-axis direction, and the Z-axis direction in the physical coordinate system. Alternatively, the three directions orthogonal to each other may be a row direction, a column direction, and a thickness direction in three-dimensional image data. On the other hand, the setting of the forward/reverse of the processing direction is to set whether the processing is performed in the forward (i.e., positive) direction or the reverse (i.e., negative) direction along the set direction. Thus, when the first and second images are three-dimensional images, a modified TRW-S algorithm of the step ST203 is performed for a total of six directions, i.e., the forward direction in each of the three orthogonal directions and the reverse direction in each of the three orthogonal directions.

FIG. 8 is a flowchart illustrating the processing of the step ST203 in more detail.

Figure 9B:
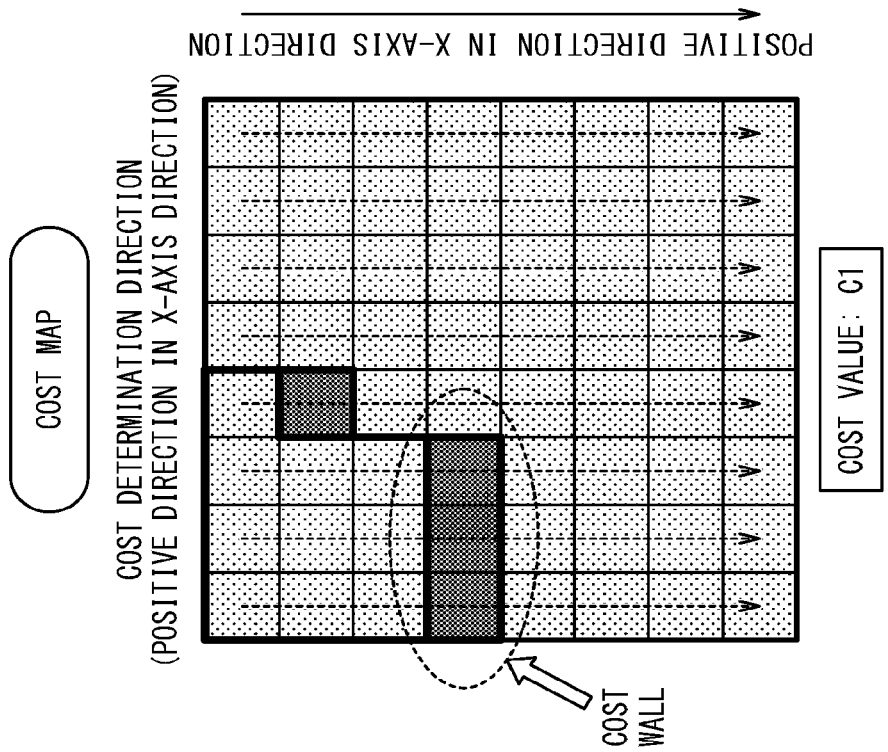
FIG. 9A and FIG. 9B are schematic diagrams illustrating the logic and concept of the advanced TRW-S algorithm according to the present embodiment.
Figure 9A:
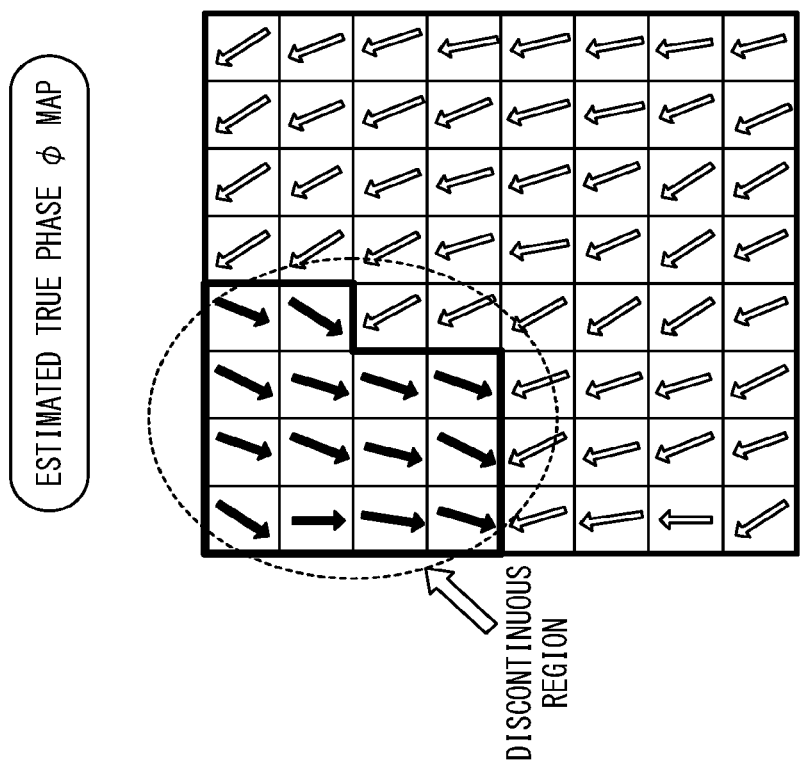

In the step ST300 of FIG. 8, the processing circuitry 40 detects a discontinuous position in the estimated true phase map, and regards the detected discontinuous position as a cost wall. FIG. 9A and FIG. 9B are schematic diagrams illustrating the concept of cost wall detection.

FIG. 9A is the same diagram as the right part of FIG. 6, and shows the estimated true phase map (φ) outputted by the processing of the basic TRW-S algorithm. As described above, a relatively large discontinuous region exists at the upper left of this estimated true phase map (φ). In the processing of the step ST300, a cost map is first generated from the estimated true phase map (φ) outputted by the processing of the basic TRW-S for detecting the cost wall. Specifically, the processing circuitry 40 generates the cost map by performing the computation of Expression 21 on the estimated true phase map (φ) in the specific one direction (i.e., in the forward or reverse direction of one of three orthogonal directions).

In the example of FIG. 9B, the processing circuitry 40 sequentially applies calculation of Expression 21 to two pixels, which are adjacent to each other in the X-axis direction of the estimated true phase map, from top to bottom in the X-axis direction so as to generate the cost map of the forward X-axis direction.

In the subsequent step ST300, when pixels each having a pixel value higher than the predetermined threshold value spatially continuously extends in the predetermined range in the generated cost map, it is determined that the cost wall has been detected in the cost map, and the cost wall is generated at the corresponding pixel position. At the outer periphery of the discontinuous region of the estimated true phase map, the value of the phase largely changes, and thus the cost pixel shows a large value as can be understood from Expression 21. Thus, the position where the cost wall is detected is mainly the outer periphery of the discontinuous region.

Note that even in the case where the value of the cost pixel exceeds a predetermined threshold value, when the position of this cost pixel is isolated in the cost map, there is a possibility of noise. Thus, this cost pixel is excluded from the target of cost wall detection.

In the next steps ST301 and ST302, the processing circuitry 40 sets the cost wall as a base point of region growing processing, and performs the region growing processing towards the opposite side in the generation direction of the cost map so as to detect an erroneously estimated region for the next substitution processing.

FIG. 10A and FIG. 10B are schematic diagrams illustrating the concept of the region growing processing of the present embodiment. Prior to the region growing processing, first, in the step ST301, the phase $\varphi_A$ and the phase $\varphi_B$ in the estimated true phase map (φ) are exchanged to generate an inverted map as illustrated in FIG. 10A.

Next, the base point (i.e., start position) of the region growing processing is set in the inverted map. For example, the position of the pixel with the largest pixel value in the cost wall is set as the base point.

Thereafter, a region similar to the pixel at the base point is taken into (i.e., added to) the region to be enlarged by the region growing processing. The region growing processing of the present embodiment is performed in a state where a restriction condition is imposed on the region-enlargement direction. For example, when the cost map is generated in the forward direction in the X-axis direction, the region growing processing is performed such that the region is enlarged from the base point in the cost wall in the direction opposite to the generation direction of the cost map (i.e., in the reverse direction of the X-axis direction).

In the region growing processing of the present embodiment, for example, the phase of the enlarged region is compared with the phase of its outer region adjacent to the enlarged region, and a pixel in the outer region having the smallest phase difference is sequentially taken into the region to be enlarged so that the area (i.e., planar dimension) of the region to be enlarged is expanded. When the phase difference between the region to be enlarged and the outer region adjacent to the region to be enlarged becomes equal to or greater than a predetermined value at every pixel position adjacent to each other, or when the area of the region to be enlarged exceeds a predetermined area, the region growing processing is completed.

The region enlarged by the region growing processing (hereinafter, referred to as the region after growing-processing) can be considered as the region of phases erroneously estimated by the basic TRW-S processing, i.e., an erroneously estimated region.

Thus, in the step ST303, either the phase map ($\varphi_A$) or the phase map ($\varphi_B$) used in the basic TRW-S processing is substituted with the phases of the erroneously estimated region.

Figure 11:
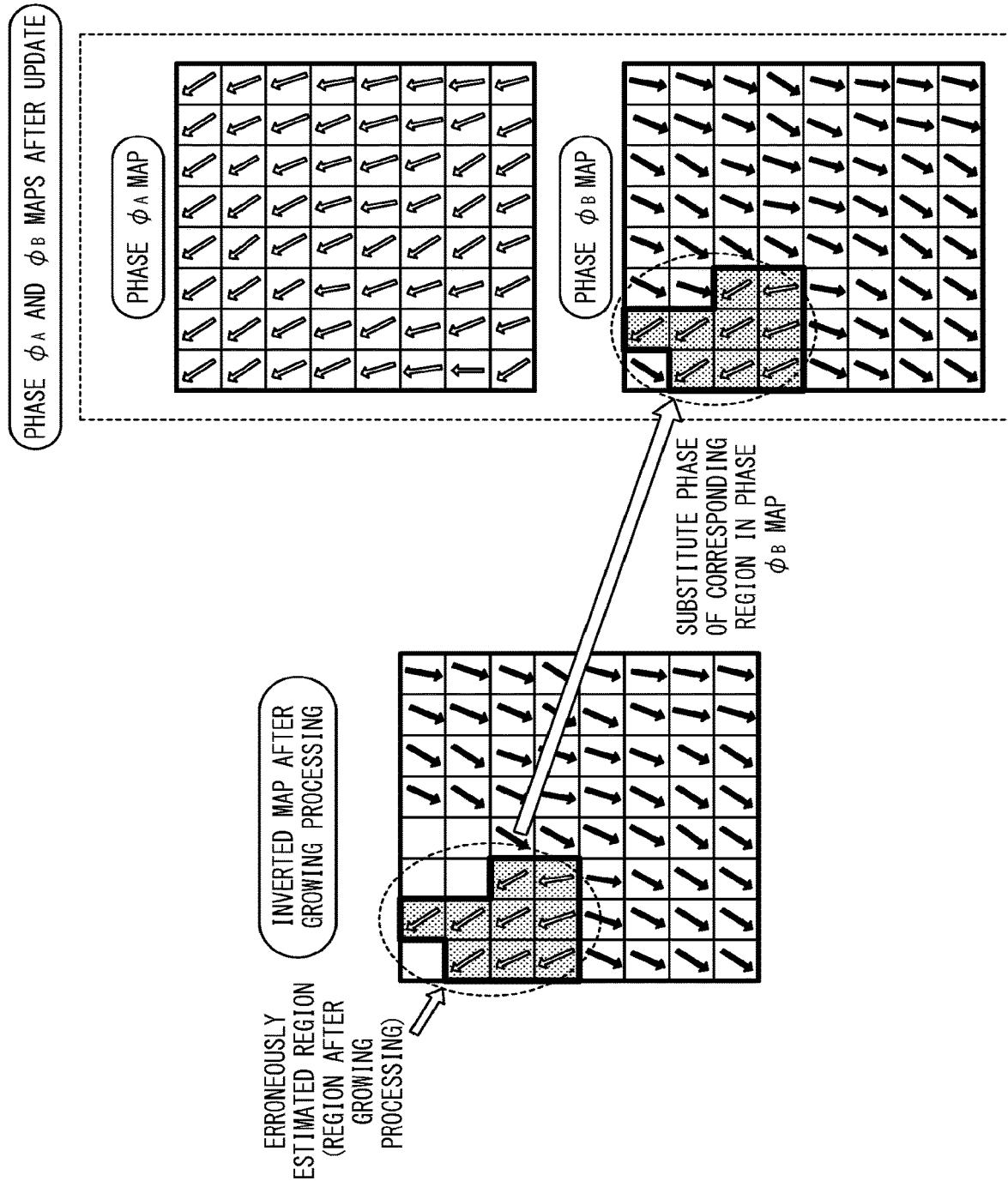
FIG. 11 is schematic diagram illustrating the logic and concept of the advanced TRW-S algorithm according to the present embodiment.

FIG. 11 is a schematic diagram illustrating the concept of the processing of the step ST303. The left part of FIG. 11 shows the inverted map including the erroneously estimated region obtained in the step ST302, which is the same as FIG. 10B. Although the erroneously estimated region indicates a region having been erroneously estimated by the basic TRW-S processing, each phase inside the erroneously estimated region indicates a phase after the error is corrected.

Thus, as shown in FIG. 11, when the inside of the erroneously estimated region of the inverted map are the phases $\varphi_A$ (i.e., white arrows), the processing circuitry 40 performs processing of substituting each phase of the region corresponding to the erroneously estimated region from $\varphi_B$ to $\varphi_A$ on the original phase map ($\varphi_B$).

In this manner, the original phase maps (TA and TB) used in the basic TRW-S processing are updated to the phase map ($\varphi_A$) and the substituted phase map ($\varphi_B$).

In the step ST304, the modified TRW-S algorithm is executed on the updated phase maps ($\varphi_A$ and $\varphi_B$) under the condition that the phase of the substituted region is fixed. Since the TRW-S algorithm of the step ST304 is different from the original TRW-S algorithm under a condition that the phase of the substituted region is fixed, the TRW-S algorithm of the step ST304 is referred to as the modified TRW-S algorithm. In the step ST304, a newly estimated true phase map ($\varphi$) is generated by executing the modified TRW-S algorithm, and a new cost map (C) is generated on the basis of the newly estimated true phase map ($\varphi$).

In the step ST305, a new cost value C is calculated by integrating the respective pixel values of the new cost map (C).

Figure 12:
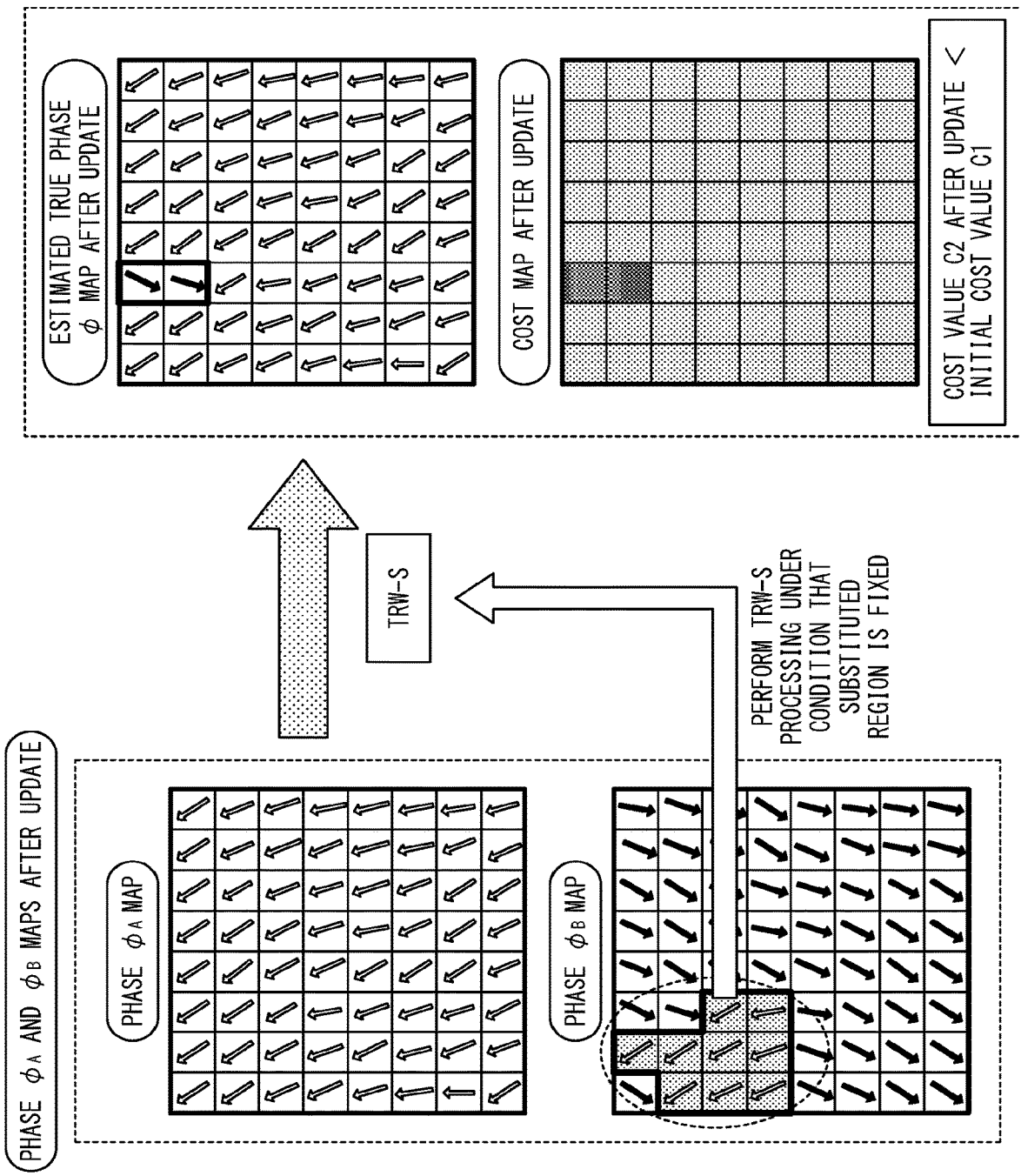
FIG. 12 is schematic diagram illustrating the logic and concept of the advanced TRW-S algorithm according to the present embodiment.

FIG. 12 is a schematic diagram illustrating the processing of the steps ST304 and ST305. The processing circuitry 40 performs the above-described modified TRW-S algorithm on the updated phase map ($\varphi_A$) and the updated phase map ($\varphi_B$), and thereby generates the updated estimated true phase map ($\varphi$) (as shown in the upper right of FIG. 12) in which the discontinuous region is significantly reduced compared with the estimated true phase map ($\varphi$) obtained by the original TRW-S algorithm as shown in FIG. 9A.

Also in the cost map (lower right part in FIG. 12) calculated from the updated estimated true phase map ($\varphi$), the region having a high cost pixel value is reduced compared with the cost map calculated by the original TRW-S algorithm. Thus, the new cost value C2 obtained by integrating all the cost pixel values of the cost map is also smaller than the cost value C1 calculated by the original TRW-S algorithm.

After the processing of the step ST305, the processing returns to the step ST204 in FIG. 7, and it is determined whether the processing of the step ST203 has been performed for each of the forward and reverse directions of all the processing directions or not (i.e., whether the processing has been performed six times or not). When the determination result is affirmative, the processing proceeds to the step ST205. Then, the cost value calculated in the original TRW-S processing is compared with the six cost values calculated in the modified TRW-S processing in the step ST203, and the estimated true phase map ($\varphi$) corresponding to the minimum cost value is selected.

The estimated true phase map ($\varphi$) finally selected in this manner is provided to the processing of the step ST90 in FIG. 5, and the water image and the fat image are generated by using this finally estimated true phase map ($\varphi$).

Further, the determination in the step ST206 is performed as required. In the step ST206, it is determined whether the cost wall has been removed or not in all the processing directions by updating the estimated true phase map ($\varphi$). If it is determined that the cost wall still remains, the above-described processing of the steps ST201 to ST205 is repeated.

(Image Processing Apparatus)

Figure 13:
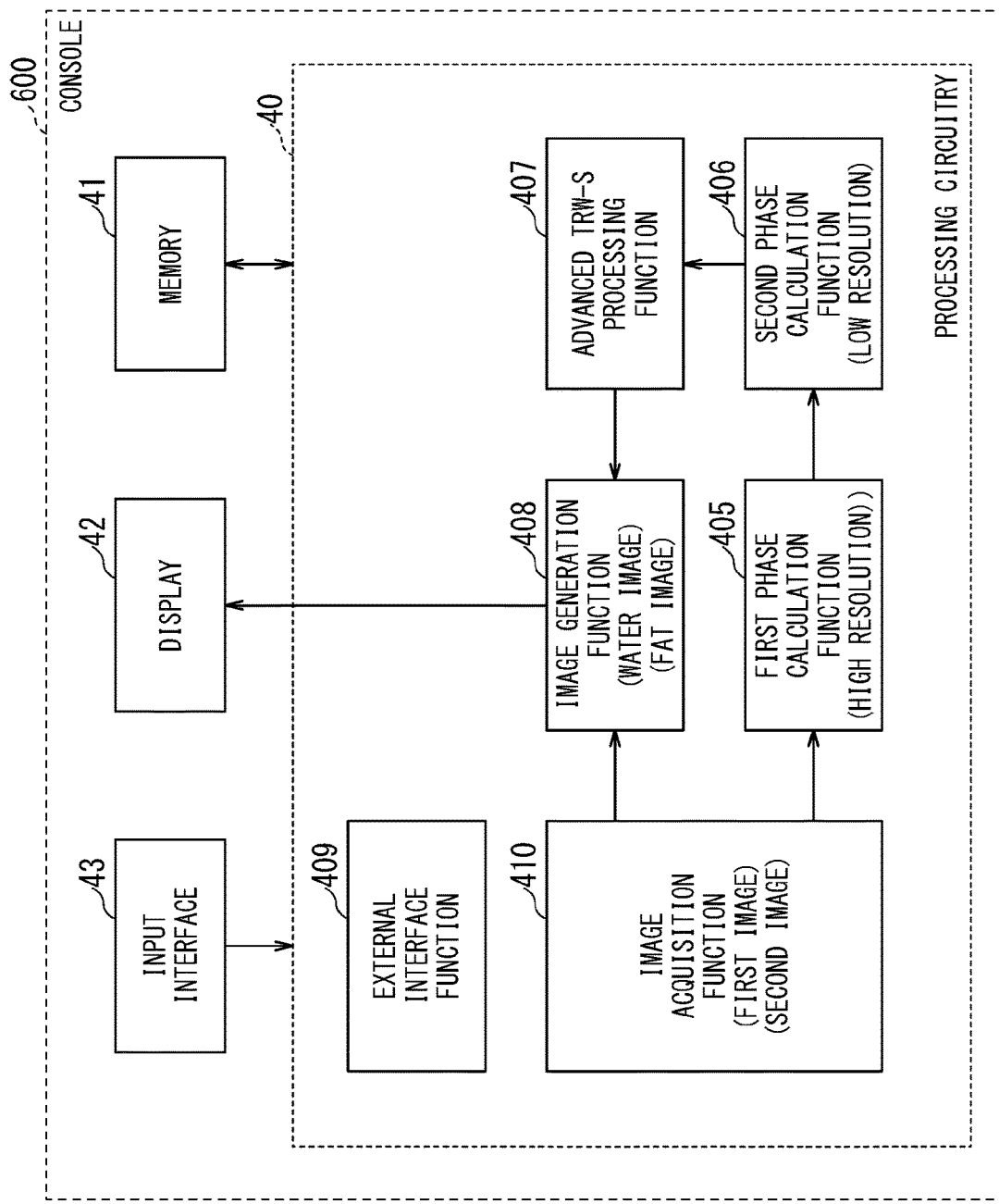
FIG. 13 is a block diagram illustrating a functional configuration of an image processing apparatus that executes the advanced TRW-S algorithm.

FIG. 13 is a block diagram illustrating a functional configuration of an image processing apparatus 600 according to one embodiment. The image processing apparatus 600 is an apparatus that performs most of the functions of the console 400 of the MRI apparatus 1, by an information processing apparatus such as a workstation, a personal computer, or a tablet computer, which is independent from the MRI apparatus 1.

The first image and the second image described above are generated by the MRI apparatus 1. In the image processing apparatus 600, the first image and the second image generated by the MRI apparatus 1 are acquired (or inputted), via an arbitrary recording medium or an arbitrary communication line by the external interface function 409 and the image acquisition function 410 shown in FIG. 13. The image processing apparatus 600 includes the processing circuitry 40 similarly to the console 400 of the MRI apparatus 1.

The processing circuitry 40 implements the first-phase calculation function 405, the second-phase calculation function 406, the advanced TRW-S processing function 407, and the image generation function 408 in addition to the image acquisition function 410 described above. These functions of the processing circuitry 40 of the image processing apparatus 600 are the same as the functions of the MRI apparatus 1 described above. The processing circuitry 40 implements each of these functions by, for example, causing the processor included in the processing circuitry 40 to execute predetermined programs stored in the memory 41.

Even with such an image processing apparatus 600, the same effects as those of the above-described MRI apparatus 1 can be obtained.

According to at least one embodiment described above, in the technique of separating a water image and a fat image by using the TRW-S algorithm, a water component region and a fat component region can be estimated more accurately with less errors.

So far, the estimated true phase map ($\varphi$) (i.e., the first phase correction data) for detecting the discontinuity has been described as being obtained by the TRW-S algorithm. Then, in the advanced TRW-S algorithm, when a discontinuity is detected in the estimated true phase map ($\varphi$), the estimated true phase map ($\varphi$) is updated so as to reduce the discontinuity, and the second phase correction data is generated from the first phase correction data.

However, the estimated true phase map ($\varphi$), from which the discontinuity is detected, does not necessarily need to be obtained by using the TRW-S algorithm, and the estimated true phase map ($\varphi$) may be estimated by a method other than the TRW-S algorithm.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An MRI apparatus comprising:
a scanner configured to acquire a plurality of magnetic resonance (MR) signals at respective different echo times from an imaging region of an object, the imaging region including a plurality of substances that are different in magnetic resonance frequency from each other; and
processing circuitry configured to
calculate phase correction data from the plurality of MR signals, the phase correction data including information on phase rotation amount due to non-uniformity of a static magnetic field,
generate an image by using the phase correction data and the plurality of MR signals in such a manner that a signal from at least one of the plurality of substances is suppressed in the image,
wherein the processing circuitry is further configured to:
generate first phase correction data composed of phase data that correspond to the phase rotation amount selected from a plurality of choices of the phase rotation amount;
calculate discontinuity of the first phase correction data; and
generate second phase correction data by substituting at least part of the first phase correction data with non-selected phase data depending on the discontinuity, the non-selected phase data corresponding to phase rotation amount that is not selected among the plurality of choices of phase rotation amount.

2. The MRI apparatus according to claim 1, wherein the processing circuitry is configured to generate the image by using the second phase correction data and the plurality of MR signals when discontinuity of the second phase correction data is determined to be lower than the discontinuity of the first phase correction data.

3. The MRI apparatus according to claim 1, wherein the processing circuitry is configured to:
generate a first image from data of the plurality of MR signals acquired at a first echo time;
generate a second image from data of the plurality of MR signals acquired at a second echo time;
calculate a first phase and a second phase for each pixel from the first image and the second image, respectively, wherein one of the first phase and the second phase is true and another is false;
to generate a first phase map and a second phase map by arranging the first phase and the second phase, respectively;
generate an estimated true phase map from the first phase map and the second phase map in such a manner that the estimated true phase map indicates true phase distribution corresponding to static magnetic field distribution at imaging time of the object, by using TRW-S (sequential tree-reweighted message-passing) algorithm; and
generate a water image and a fat image by using the first image, the second image, and the estimated true phase map.

4. The MRI apparatus according to claim 3, wherein the processing circuitry is configured to:
detect an erroneously estimated region in the estimated true phase map;
substitute each phase of a corresponding region of the second phase map with the first phase when a region of the first phase is erroneously estimated as a region of the second phase in the erroneously estimated region;
substitute each phase of the corresponding region of the first phase map with the second phase when a region of the second phase is erroneously estimated as a region of the first phase in the erroneously estimated region;
update the estimated true phase map by executing the TRW-S algorithm under a condition in which each phase of the substituted region is fixed; and
generate the water image and the fat image by using the first image, the second image, and the estimated true phase map having been updated.

5. The MRI apparatus according to claim 3, wherein the processing circuitry is configured to:
generate a cost map in which each pixel value is an index value representing smoothness of an adjacent phase in the estimated true phase map; and
detect the erroneously estimated region based on a pixel value of the cost map.

6. The MRI apparatus according to claim 5, wherein the processing circuitry is configured to:
generate the cost map for each of an initial estimated true phase map and an updated estimated true phase map;
calculate a cost value for each of the initial estimated true phase map and the updated estimated true phase map, the cost value being obtained by integrating each pixel value of the cost map; and
determine the updated estimated true phase map as a finally estimated true phase map when the cost value of the updated estimated true phase map becomes smaller than the cost value of the initial estimated true phase map.

7. The MRI apparatus according to claim 5, wherein the processing circuitry is configured to:
generate the cost map by performing predetermined computation on the estimated true phase map in one specific direction;
generate a cost wall inside the cost map when pixel values exceeding a predetermined threshold continue in a predetermined range in the cost map;
detect the erroneously estimated region by performing region growing processing towards an opposite side in a generation direction of the cost map in such a manner that the cost wall is used as a base point of the region growing processing; and
update the estimated true phase map by substitution of the erroneously estimated region.

8. The MRI apparatus according to claim 7, wherein the processing circuitry is configured to:
generate a cost map corresponding to an initial estimated true phase map;
generate six updated estimated true phase map and six cost maps by performing the predetermined computation on the initial estimated true phase map in a forward direction of each of three axial directions orthogonal to each other and a reverse direction of each of the three axial directions;
calculate a cost value for each of the six cost maps and a cost map of the initial estimated true phase map, the cost value being obtained by integrating each pixel value of a cost map; and output an estimated true phase map corresponding to a minimum cost value as a finally estimated true phase map.

9. An image processing apparatus comprising processing circuitry configured to:
 input a plurality of complex images generated from a plurality of MR signals that are acquired at respective different echo times from an imaging region of an object, the imaging region including a plurality of substances that are different in magnetic resonance frequency from each other;
 calculate phase correction data from the plurality of complex images, the phase correction data including information on phase rotation amount due to non-uniformity of a static magnetic field; and
 generate an image by using the phase correction data and the plurality of MR signals in such a manner that a signal from at least one of the plurality of substances is suppressed in the image,
 wherein the processing circuitry is further configured to:
  generate first phase correction data composed of phase data that correspond to the phase rotation amount selected from a plurality of choices of the phase rotation amount;
  calculate discontinuity of the first phase correction data; and
  generate second phase correction data by substituting at least part of the first phase correction data with non-selected phase data depending on the discontinuity, the non-selected phase data corresponding to phase rotation amount that is not selected among the plurality of choices of phase rotation amount.

10. The image processing apparatus according to claim 9, wherein the processing circuitry is configured to generate the image by using the second phase correction data and the plurality of MR signals when discontinuity of the second phase correction data is determined to be lower than the discontinuity of the first phase correction data.

11. The image processing apparatus according to claim 9, wherein the processing circuitry is configured to:
 acquire a first complex image and a second complex image, the first complex image being generated from data of the plurality of MR signals that are acquired at a first echo time, the second complex image being generated from data of the plurality of MR signals that are acquired at a second echo time;
 calculate a first phase and a second phase for each pixel from the first complex image and the second complex image, respectively, wherein one of the first phase and the second phase is true and another is false;
 to generate a first phase map and a second phase map by arranging the first phase and the second phase, respectively;
 generate an estimated true phase map from the first phase map and the second phase map in such a manner that the estimated true phase map indicates true phase distribution corresponding to static magnetic field distribution at imaging time of the object, by using TRW-S algorithm; and
 generate a water image and a fat image by using the first complex image, the second complex image, and the estimated true phase map.

12. The image processing apparatus according to claim 11, wherein the processing circuitry is configured to:
 detect an erroneously estimated region in the estimated true phase map;
 substituting each phase of a corresponding region of the second phase map with the first phase when a region of the first phase is erroneously estimated as a region of the second phase in the erroneously estimated region;
 substituting each phase of the corresponding region of the first phase map with the second phase when a region of the second phase is erroneously estimated as a region of the first phase in the erroneously estimated region;
 update the estimated true phase map by executing the TRW-S algorithm under a condition in which each phase of the substituted region is fixed; and
 generate the water image and the fat image by using the first complex image, the second complex image, and the estimated true phase map having been updated.

13. An image processing method comprising;
 inputting a plurality of complex images generated from a plurality of MR signals that are acquired at respective different echo times from an imaging region of an object, the imaging region including a plurality of substances that are different in magnetic resonance frequency from each other;
 calculating phase correction data from the plurality of complex images, the phase correction data including information on phase rotation amount due to non-uniformity of a static magnetic field;
 generating an image by using the phase correction data and the plurality of MR signals in such a manner that a signal from at least one of the plurality of substances is suppressed in the image;
 generating first phase correction data composed of phase data that correspond to the phase rotation amount selected from a plurality of choices of the phase rotation amount;
 calculating discontinuity of the first phase correction data; and
 generate second phase correction data by substituting at least part of the first phase correction data with non-selected phase data depending on the discontinuity, the non-selected phase data corresponding to phase rotation amount that is not selected among the plurality of choices of phase rotation amount.

14. The image processing method according to claim 13, wherein the image is generated by using the second phase correction data and the plurality of MR signals when discontinuity of the second phase correction data is determined to be lower than the discontinuity of the first phase correction data.

15. The image processing method according to claim 13, further comprising:
 inputting a first complex image and a second complex image, the first complex image being generated from data of the plurality of MR signals that are acquired at a first echo time, the second complex image being generated from data of the plurality of MR signals that are data acquired at a second echo time;
 calculating a first phase and a second phase for each pixel from the first complex image and the second complex image, respectively, wherein one of the first phase and the second phase is true and another is false;
 to generate a first phase map and a second phase map by arranging the first phase and the second phase, respectively;
 generating an estimated true phase map from the first phase map and the second phase map in such a manner that the estimated true phase map indicates true phase distribution corresponding to static magnetic field distribution at imaging time of the object, by using TRW-S algorithm; and generating a water image and a fat image by using the first complex image, the second complex image, and the estimated true phase map.

16. The image processing method according to claim 15, further comprising:

detecting an erroneously estimated region in the estimated true phase map;

substituting each phase of a corresponding region of the second phase map with the first phase when a region of the first phase is erroneously estimated as a region of the second phase in the erroneously estimated region;

substituting each phase of the corresponding region of the first phase map with the second phase when a region of the second phase is erroneously estimated as a region of the first phase in the erroneously estimated region;

updating the estimated true phase map by executing the TRW-S algorithm under a condition in which each phase of the substituted region is fixed; and generating the water image and the fat image by using the first complex image, the second complex image, and the estimated true phase map having been updated.

* * * * *